(12) United States Patent
Savchenkov et al.

(10) Patent No.: US 8,124,927 B2
(45) Date of Patent: Feb. 28, 2012

(54) DETECTING LIGHT IN WHISPERING-GALLERY-MODE RESONATORS

(75) Inventors: Anatoliy Savchenkov, La Crescenta, CA (US); Lutfollah Maleki, Pasadena, CA (US); Makan Mohageg, Valley Village, CA (US); Thanh M. Le, Duarte, CA (US)

(73) Assignee: California Institute of Technology, Pasadena, CA (US)

( * ) Notice: Subject to any disclaimer, the term of this patent is extended or adjusted under 35 U.S.C. 154(b) by 1186 days.

(21) Appl. No.: 11/754,959

(22) Filed: May 29, 2007

(65) Prior Publication Data
US 2010/0264300 A1    Oct. 21, 2010

(51) Int. Cl.
*G02B 6/26* (2006.01)
*G02B 6/42* (2006.01)
*G02F 1/035* (2006.01)

(52) U.S. Cl. .................................. 250/227.24; 385/30
(58) Field of Classification Search ............. 250/227.24; 372/26, 27; 385/31, 32, 36, 39, 30
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 * | 10/2002 | Maleki et al. ............. 359/245 |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 * | 12/2002 | Maleki et al. ............. 356/436 |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,633,696 B1 * | 10/2003 | Vahala et al. ............. 385/27 |
| 6,762,869 B2 | 7/2004 | Maleki et al. | |

(Continued)

FOREIGN PATENT DOCUMENTS

WO    01/96936    12/2001

(Continued)

OTHER PUBLICATIONS

International Preliminary Report on Patentability dated Dec. 10, 2009 for International Application No. PCT/US2007/069905, filed May 29, 2007 (7 pages).

(Continued)

*Primary Examiner* — John Lee
(74) *Attorney, Agent, or Firm* — Perkins Coie LLP

(57) ABSTRACT

An optical device including a whispering gallery mode (WGM) optical resonator configured to support one or more whispering gallery modes; and a photodetector optically coupled to an exterior surface of the optical resonator to receive evanescent light from the optical resonator to detect light inside the optical resonator.

20 Claims, 6 Drawing Sheets

U.S. PATENT DOCUMENTS

| | | | |
|---|---|---|---|
| 6,781,696 B1* | 8/2004 | Rosenberger et al. | 356/437 |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,085,452 B1 | 8/2006 | Lin et al. | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 | 3/2007 | Ilchenko et al. | |
| 7,218,662 B1 | 5/2007 | Ilchenko et al. | |
| 7,242,705 B2* | 7/2007 | Kneissl et al. | 372/67 |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,369,722 B2 | 5/2008 | Yilmaz et al. | |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 7,595,890 B2* | 9/2009 | Fan et al. | 356/480 |
| 7,630,417 B1* | 12/2009 | Maleki et al. | 372/20 |
| 7,729,047 B1* | 6/2010 | Savchenkov et al. | 359/346 |
| 7,777,583 B2* | 8/2010 | Taber et al. | 331/96 |
| 7,801,189 B2* | 9/2010 | Maleki et al. | 372/26 |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0202422 A1 | 10/2004 | Gunn, III | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0088657 A1 | 4/2005 | Sugawara et al. | |
| 2005/0123306 A1 | 6/2005 | Ilchenko et al. | |
| 2005/0128566 A1 | 6/2005 | Savchenkov et al. | |
| 2005/0135453 A1* | 6/2005 | Kneissl et al. | 372/94 |
| 2005/0175358 A1 | 8/2005 | Ilchenko et al. | |
| 2005/0210989 A1 | 9/2005 | Ja et al. | |
| 2005/0248823 A1 | 11/2005 | Maleki et al. | |
| 2007/0009205 A1 | 1/2007 | Maleki et al. | |
| 2007/0153289 A1 | 7/2007 | Yilmaz et al. | |
| 2007/0230870 A1* | 10/2007 | Smith et al. | 385/32 |
| 2007/0274621 A1* | 11/2007 | Clapp | 385/3 |
| 2008/0001062 A1 | 1/2008 | Gunn et al. | |
| 2008/0008418 A1* | 1/2008 | Smith et al. | 385/32 |
| 2008/0075464 A1 | 3/2008 | Maleki et al. | |
| 2008/0265147 A1* | 10/2008 | Fan et al. | 250/227.24 |
| 2008/0310463 A1 | 12/2008 | Maleki et al. | |
| 2009/0097516 A1* | 4/2009 | Maleki et al. | 372/26 |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ilchenko, V., et al., "Sub-Micro Watt Photonic Microwave Receiver," *IEEE Photonics Technology Letters*, 14(11):1602-1604, Nov. 2002.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-*Q* Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

\* cited by examiner

FIG. 3
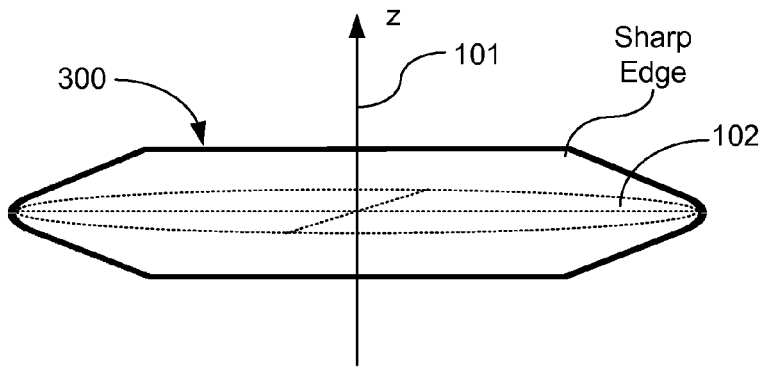
FIG. 4A   FIG. 4B
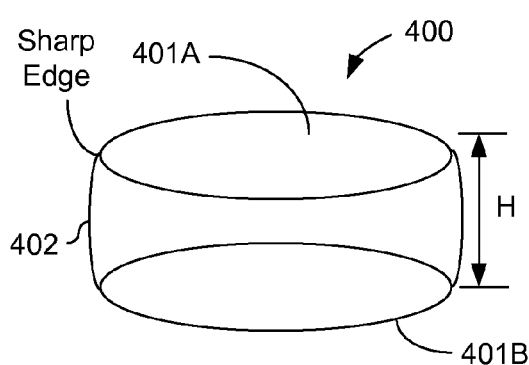 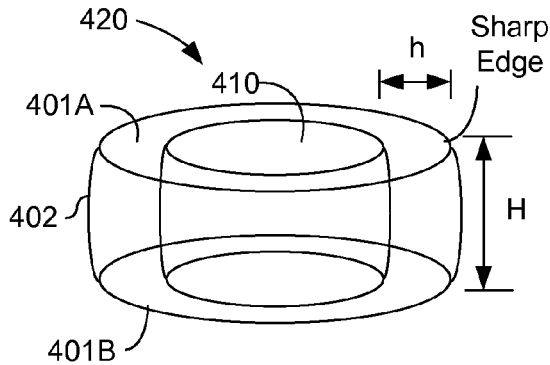
FIG. 5A   FIG. 5B
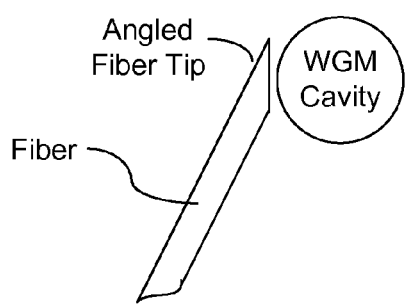 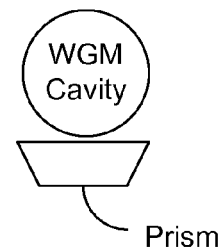

DETECTING LIGHT IN WHISPERING-GALLERY-MODE RESONATORS

STATEMENT REGARDING FEDERALLY SPONSORED RESEARCH

The systems and techniques described herein were made in the performance of work under a NASA contract, and are subject to the provisions of Public Law 96-517 (35 USC 202) in which the Contractor has elected to retain title.

BACKGROUND

This application relates to optical resonators and cavities.

A dielectric material may be shaped to construct an optical whispering-gallery-mode ("WGM") resonator which supports one or more whispering gallery ("WG") modes. These WG modes represent optical fields confined in an interior region close to the surface of the resonator due to the total internal reflection at the boundary. For example, microspheres with diameters from few tens of microns to several hundreds of microns have been used to form compact optical WGM resonators. Such a spherical resonator can include at least a portion of the sphere that comprises the sphere's equator. The resonator dimension is generally much larger than the wavelength of light so that the optical loss due to the finite curvature of the resonators is small. As a result, a high quality factor, Q, may be achieved in such resonators. Some microspheres with sub-millimeter dimensions have been demonstrated to exhibit very high quality factors for light waves, ranging from $10^3$ to $10^9$ for quartz microspheres. Hence, optical energy, once coupled into a whispering gallery mode, can circulate within the WGM resonator with a long photon life time. Such hi-Q WGM resonators may be used in many optical applications, including optical filtering, optical delay, optical sensing, lasers, and opto-electronic oscillators.

SUMMARY

In one implementation, an optical device can include a whispering gallery mode (WGM) optical resonator configured to support one or more whispering gallery modes; and a photodetector optically coupled to an exterior surface of the optical resonator to receive evanescent light from the optical resonator to detect light inside the optical resonator. The photodetector may be in direct contact with the exterior surface of the optical resonator. The photodetector may also be separated from the exterior surface of the optical resonator by a gap. In addition, a transparent material may be placed between the photodetector and the exterior surface of the optical resonator.

In another implementation, an optical device can include first and second optical resonators each configured to support whispering gallery modes. The first and said second optical resonators are optically coupled to each other to allow for light coupling from a first whispering gallery mode in the first optical resonator to a second whispering gallery mode in the second optical resonator. This device can also include a first photodetector optically coupled to the first optical resonator to detect light in the first optical resonator; and a second photodetector optically coupled to the second optical resonator to detect light in the second optical resonator.

A method is also provided in this application where a photodetector is placed near or in contact with an exterior surface of a whispering gallery mode (WGM) optical resonator to optically couple the photodetector to an evanescent field of light in the optical resonator. The photodetector is used to receive evanescent light from the optical resonator to detect light inside the optical resonator.

These and other implementations are now described in greater detail in the following drawings, the detailed description, and the claims.

BRIEF DESCRIPTION OF THE DRAWINGS

FIGS. 1, 2, 3, 4A, and 4B illustrate various exemplary resonator configurations that support whispering gallery modes.

FIGS. 5A and 5B illustrate two evanescent coupling examples.

DETAILED DESCRIPTION

Examples and implementations of optical devices in this application include a whispering gallery mode (WGM) optical resonator configured to support one or more whispering gallery modes, and a photodetector optically coupled to an exterior surface of the optical resonator to receive evanescent light from the optical resonator to detect light inside the optical resonator. The photodetector can be a semiconductor photodetector (e.g., Si, Ge, InGaAs, etc.) and has a sensing surface that is placed in the evanescent field of light confined in the optical resonator. The photodetector can be in direct contact with or spaced from an exterior surface of the optical resonator to directly and evanescently coupled to the optical resonator.

Figure 1:
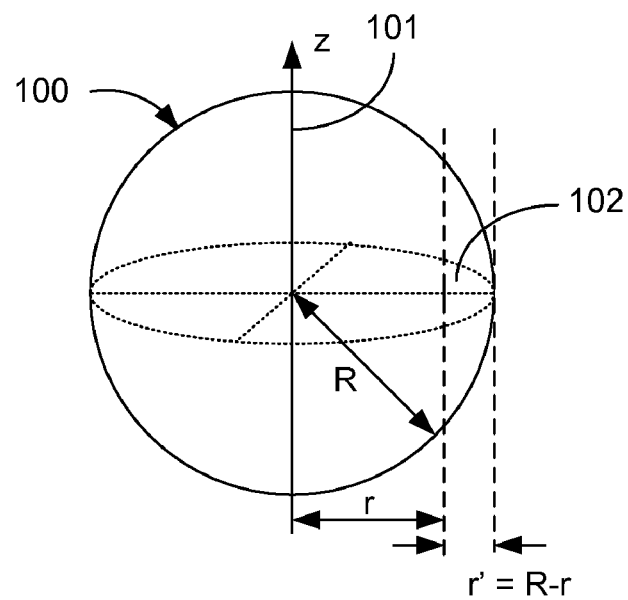
Figure 2:
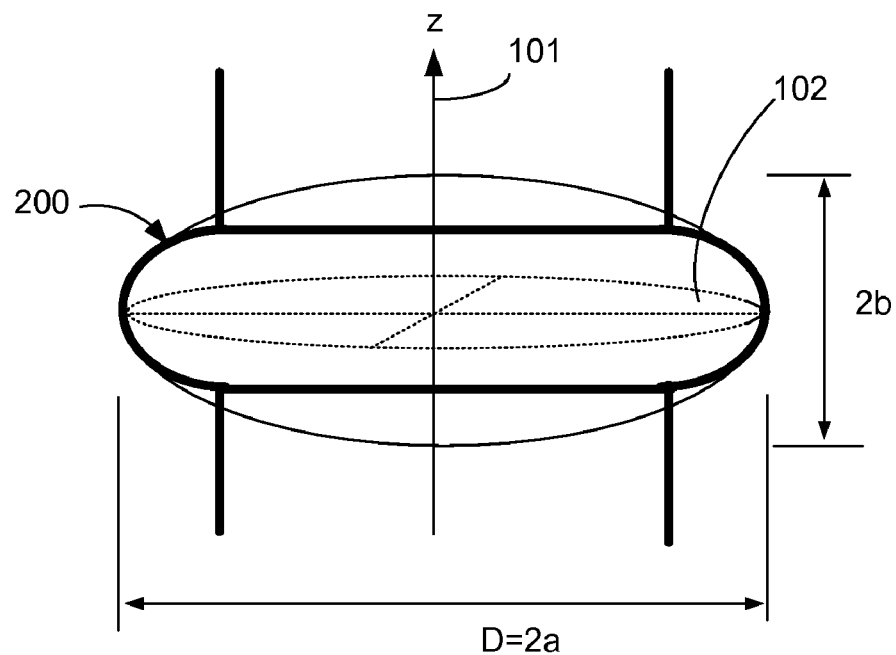

The geometries of the WGM resonators may be in various configurations. FIGS. 1, 2, and 3 illustrate three exemplary geometries for implementing such WGM resonators.

FIG. 1 shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2 shows an exemplary spheriodal microresonator 200. This resonator 200 may be formed by revolving an ellipse (with axial lengths a and b) around the symmetric axis along the short elliptical axis 101 (z). Therefore, similar to the spherical resonator in FIG. 1, the plane 102 in FIG. 2 also has a circular circumference and is a circular cross section. Different from the design in FIG. 1, the plane 102 in FIG. 2 is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 (z) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 1 and 2, the exterior surface provides curvatures in both the direction in the plane 102 and the direction of z perpendicular to the plane 102 to confine and support the WG modes. Such a non-spherical, non-elliptical surface may be, among others, a parabola or hyperbola. The plane 102 in FIG. 3 is a circular cross section and a WG mode circulates around the circle in the equator.

The above three exemplary geometries in FIGS. 1, 2, and 3 share a common geometrical feature that they are all axially or cylindrically symmetric around the axis 101 (z) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to for the WGM resonator. For example, rings, disks and other geometries formed from a proper section of a sphere may be used as a spherical WGM resonator.

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 3, 4A, and 4B. The exterior curved surface 402 can be selected from any of the shapes shown in FIGS. 1, 2, and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

In WGM resonators with uniform indices, a part of the electromagnetic field of the WG modes is located at the exterior surface of the resonators. A gap between the optical coupler and the WGM resonator with a uniform index is generally needed to achieve a proper optical coupling. This gap is used to properly "unload" the WG mode. The Q-factor of a WG mode is determined by properties of the dielectric material of the WGM resonator, the shape of the resonator, the external conditions, and strength of the coupling through the coupler (e.g. prism). The highest Q-factor may be achieved when all the parameters are properly balanced to achieve a critical coupling condition. In WGM resonators with uniform indices, if the coupler such as a prism touches the exterior surface of the resonator, the coupling is strong and this loading can render the Q factor to be small. Hence, the gap between the surface and the coupler is used to reduce the coupling and to increase the Q factor. In general, this gap is very small, e.g., less than one wavelength of the light to be coupled into a WG mode. Precise positioning devices such as piezo elements may be used to control and maintain this gap at a proper value.

A photodetector can be in direct contact with or spaced from an exterior surface of the optical resonator to directly and evanescently couple to the optical resonator to receive light from the optical resonator. FIGS. 6, 7 and 8A and 8B show example configurations for coupling such a photodetector to a WGM resonator.

Figure 6:
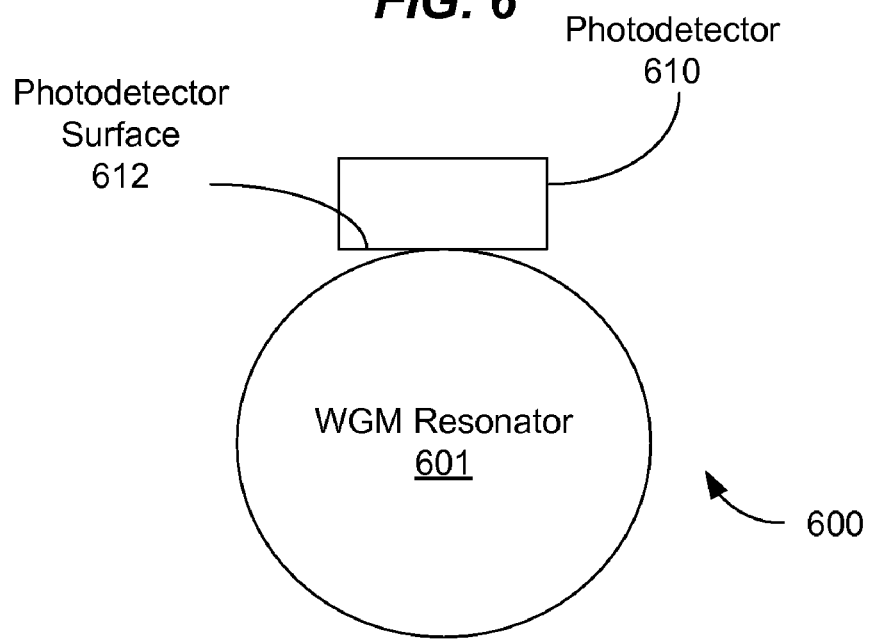
FIGS. 6, 7, 8A and 8B show three examples of WGM resonators that are directly coupled to a photodetector.

FIG. 6 shows a WGM resonator 601 in direct contact with a photodetector 610. The photodetector 610 includes a photodetector surface 612 to receive light for detection. This surface 612 is placed in contact with the exterior surface of the WGM resonator 601 so that the light in the evanescent field of a WG mode in the optical resonator 601 is received by the surface 612 and the received light is converted into a detector signal.

Figure 7:
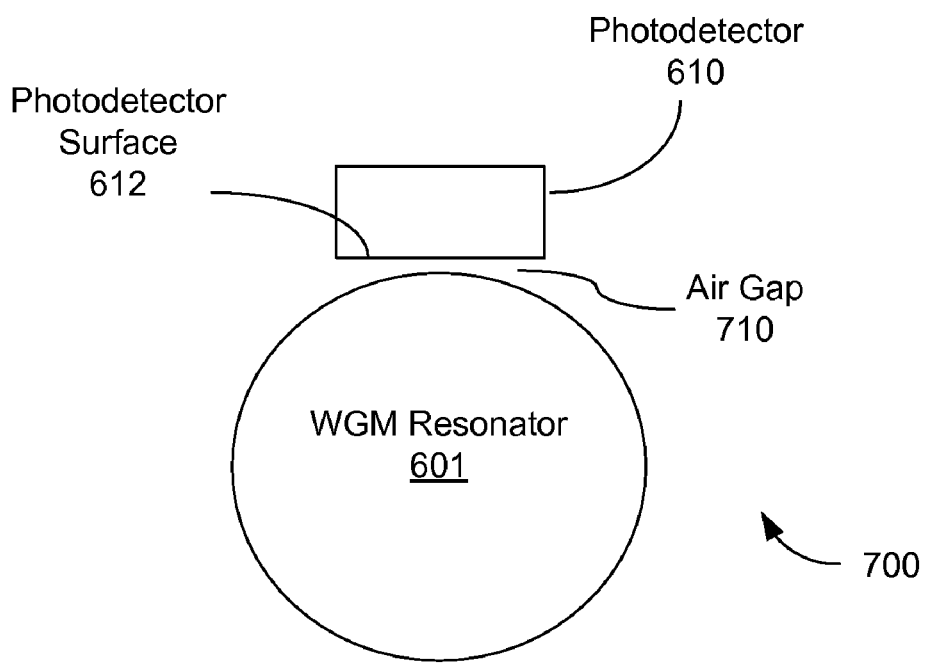

FIG. 7 shows another coupling design where a WGM resonator 601 and a photodetector 610 are spaced from each other by an air gap 710. The gap 710 is sufficiently small so that the photodetector surface 612 is within the reach of the evanescent field of a WG mode in the optical resonator 601 and the received light is converted into a detector signal.

The optical coupling between the photodetector 610 and the WGM resonator 601 is stronger in the configuration in FIG. 6 than that in FIG. 7. Such coupling can affect the quality factor Q of the WGM resonator 601. The gap 710 in the configuration in FIG. 7 can be adjusted to adjust the coupling strength to maintain a desired Q for the WGM resonator 601.

Figure 8A:
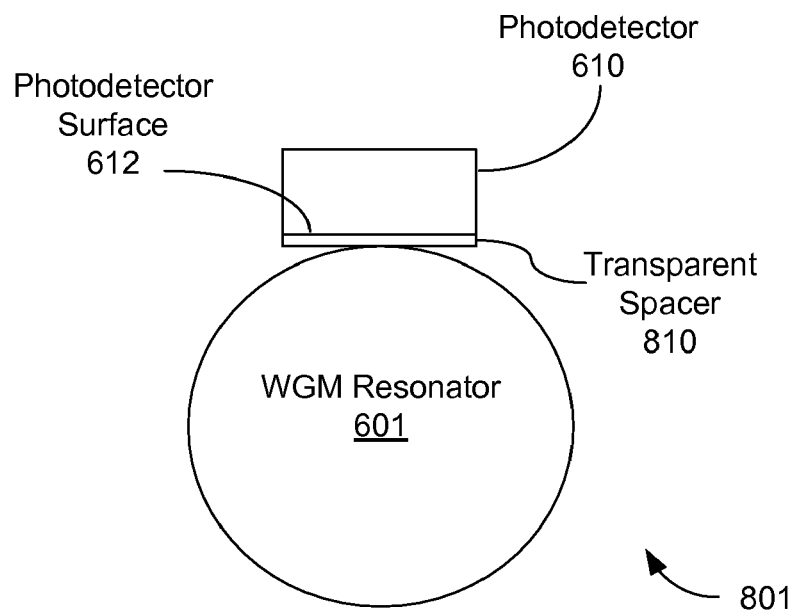
Figure 8B:
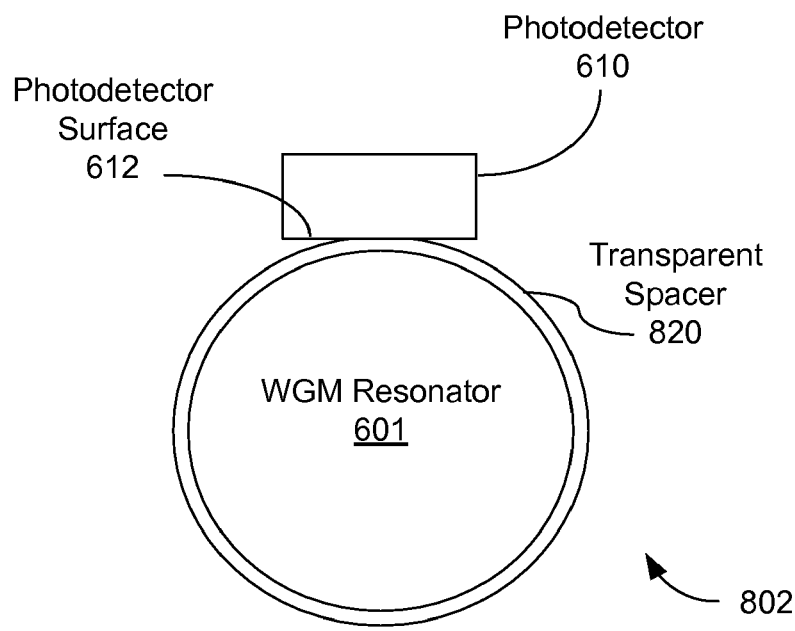

FIGS. 8A and 8B show two examples where a transparent spacer or a lightspan spacer is placed between the photodetector 610 and the WGM resonator 601 to allow for direct coupling of light from the resonator 601 into the detector 610. The thickness of the spacer can be controlled to set the coupling strength between the photodetector 610 and the WGM resonator 601. To reduce the Q of the resonator 601, the thickness of the spacer can be reduced. The thickness of the spacer can be increased to decrease the detector-resonator coupling and to increase the Q of the resonator 601. In one implementation, the refractive index of the spacer is less than the refractive index of the photodetector 610 and the refractive index of the WGM resonator 601. A polymer material, for example, can be used to implement such a spacer. As a specific example in a CaF2 WGM resonator, a polymer coating with a refractive index around 1.33 and a thickness of 50 to 150 nm can be placed on a detector surface as the spacer.

In FIG. 8A, the spacer is a transparent layer 810 coated on the surface 612 of the photodetector 610 and the layer 810 is in contact with the exterior of the WGM resonator 601. In FIG. 8B, the spacer is a transparent layer coated on the exterior of the WGM resonator 601 and the surface 612 of the photodetector 610 is placed in direct contact with the layer 820. The thickness of the spacer can be set during the coating process for a desired coupling strength. The photodetector 610 can be placed on a metal strip line that provides electrical contact for the photodetector 610.

The above direct coupling between the photodetector 610 and the WGM resonator 601 eliminates the need for an optical coupler between the photodetector 610 and the WGM resonator 601 and associated alignment operations for aligning the optical coupler to the WGM resonator 601. Hence, the photodetector 610 and the WGM resonator 601 are integrated to each other with direct optical coupling. This integrated assembly of the photodetector 610 and the WGM resonator 601 can be used in various applications.

For example, such an integrated assembly of the photodetector 610 and the WGM resonator 601 can be used as an optical filter. A single WGM resonator as an optical filter generally produces a Lorentzian-shaped filter function. Non-Lorentzian filter functions may be desirable in certain applications. For example, a sharper spectral roll-off than the typical Lorentzian filter function may be desired filtering certain optical signals. As another example, it may be desirable to have a relatively flatter spectral passband than a Lorentzian filter function. A composite filter may thus be constructed to produce such and other non-Lorentzian filter functions by optically cascading and coupling two or more WGM resonators. In this composite filter, an input optical signal passes through the WGM resonators and is filtered more than once to produce the desired output spectral profile in the optical transmission of the filter.

Figure 9:
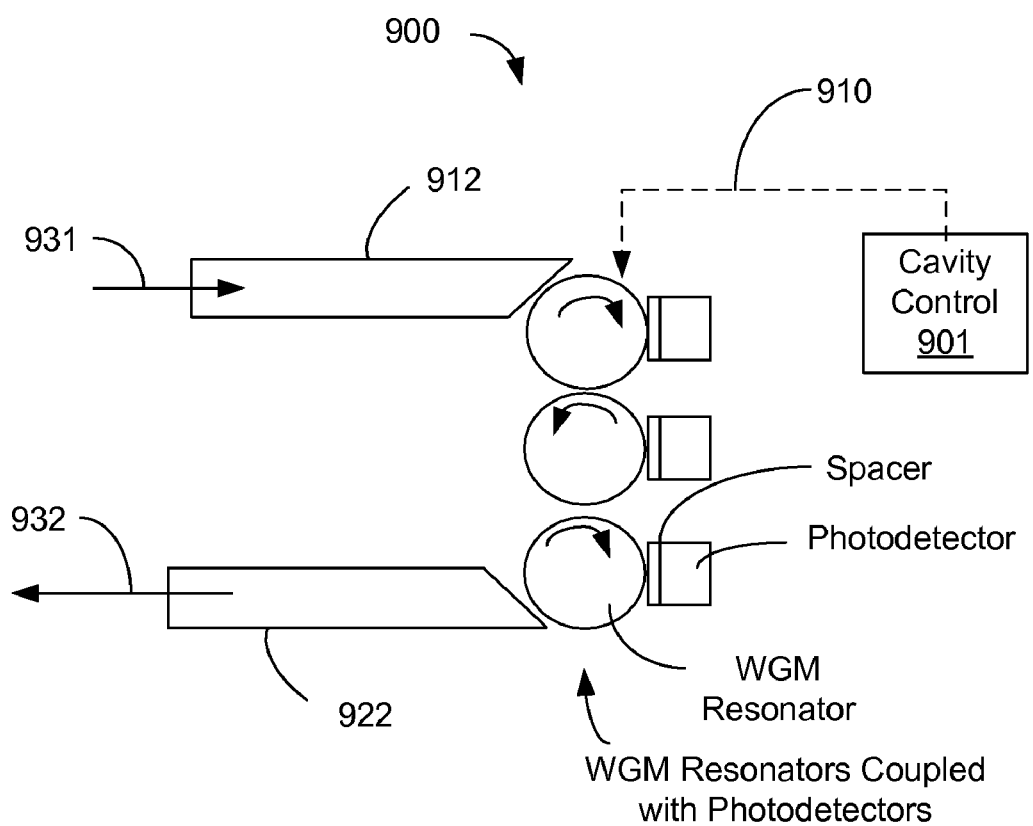
FIG. 9 shows an optical filter with two or more WGM resonators cascaded to form an optical filter where each WGM resonator is directly coupled to a photodetector.

In designing such a composite filter, the resonator frequencies of the cascaded WGM resonators are set to be close to one anther to overlap their respective filter functions. It is desirable that the relative positions of the resonator frequencies are properly selected in order to achieve the desired filter function for the composite filter. Certainly, the relative positions of the resonator frequencies may be permanently fixed during fabrication of the WGM resonators and assembly of the composite filter. However, it may be preferable that such a composite filter be tunable so that a specific composite filter function may be generated and changed at a user's choice. The tuning is temporary in the sense that the composite filter function is constant when the corresponding control signal is set a particular state or value. As the control signal is adjusted, the composite filter function is also changed accordingly. Therefore, the composite filter may be dynamically adjusted during operation of the filter or set to produce different filter functions for different operating conditions or in different applications. This tunability in the non-Lorentzian filter function can provide the user with the flexibility in using the same composite filter in different operating conditions and in different applications FIG. 9 shows an exemplary composite filter having three cascaded WGM resonators optically cascaded with one another. The resonators may be identical and may be different. In some implementations, the resonators may have approximately the same diameter or dimension to have similar quality factors. In certain other implementations, it may be advantageous to use different resonators with different geometries or physical dimension to use their difference in the spectral profile to produce the desired composite filter function. Two adjacent resonators are placed close to or in contact with each other to allow for direct optical coupling under proper resonance conditions. Alternatively, an optical coupling mechanism may be placed between two adjacent resonators to assist and facilitate the inter-resonator optical coupling. An input optical coupler 912 is placed near or in contact with the first resonator to couple an input optical signal 931 into the first resonator of the filter 900. An output optical coupler 922 is placed near or in contact with the third resonator to couple optical energy inside the third resonator out to produce an output optical signal 932 as the transmission of the filter 900. A support base, such as a substrate, may be used to hold and fix the components of the filter 600 in position. Implementation of additional cascaded resonators allows for additional flexibility in designing the final composite filter function and produces higher order filter functions.

In one implementation, at least one resonator in FIG. 9 can be a tunable WGM resonator. A cavity control unit 901 is coupled to control and tune the tunable resonator via a control signal 910. In general, the tunable resonator may be tuned in any suitable manner by using the control signal 910 to adjust a parameter of the resonator, e.g., a direct change in its refractive index, its temperature, its geometry, etc. Such a change causes the cavity resonance to shift relative to the resonance of another resonator, or other parameter in the output of the tunable resonator (e.g., the linewidth) to change. The corresponding control signal may be adjusted to tune and set the resonator to any point within the operating range if needed.

Various mechanisms may be used to tune a WGM resonator. The dielectric material, the shape and dimension of the resonator, the conditions of the surroundings of the resonator, and the coupling of the optical coupler for the resonator may affect the spectral properties of the resonator. For a given dielectric material under known surrounding conditions, a resonator may be tuned to alter its spectral properties by changing the shape of the resonator through, e.g., stretching or compressing the resonator. In another example, the temperature of the resonator may be controlled to change both of its dimension and its refractive index to change the filter function of the resonator.

In particular, a WGM resonator may be made of a material whose index changes in response to an applied stimulus such as a radiation field or an electric field. Such tuning mechanisms avoid certain complications associated with a change in the shape or dimension of the resonator. For example, an electro-optic material may be used to construct the WGM resonator and an external electric field may be applied to change the refractive index of the resonator in tuning the resonator.

Figure 10A:
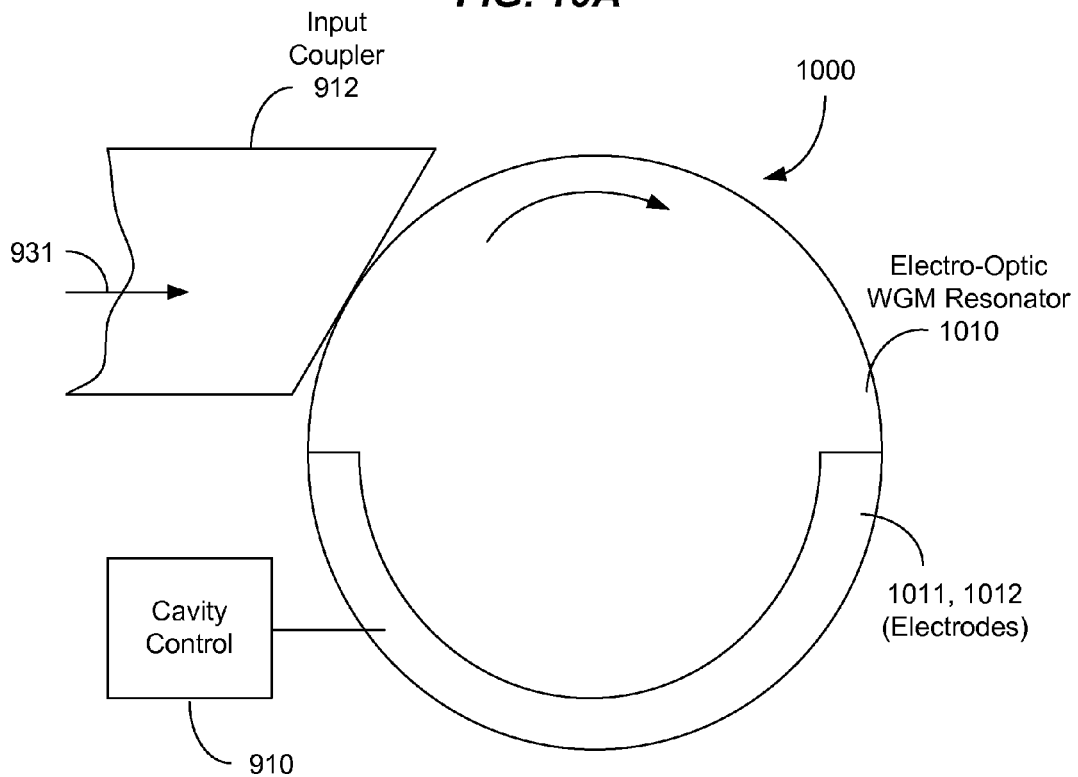
FIGS. 10A and 10B show one implementation of a tunable WGM resonator based on an electro-optic effect.
Figure 10B:
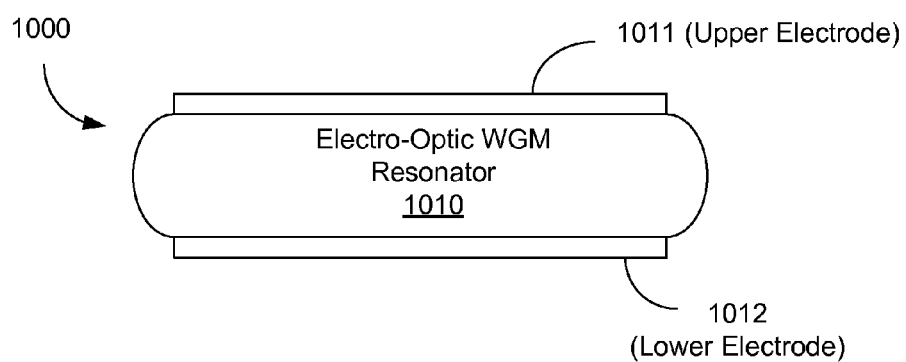

FIGS. 10A and 10B shows an example of a tunable electro-optic WGM resonator 1000 used as the first resonator 610 in FIG. 9A. Such an electro-optic WGM resonator may also be used as the second resonator in FIG. 9A. The electro-optic material for the resonator 1000 may be any suitable material, including an electro-optic crystal such as Lithium Niobate and semiconductor multiple quantum well structures. One or more electrodes 1011 and 1012 may be formed on the resonator 1000 to apply the control electrical field in the region where the WG modes are present to control the index of the electro-optical material and to change the filter function of the resonator. Assuming the resonator 1000 has disk or ring geometry as in FIG. 4A or 4B, the electrode 1011 may be formed on the top of the resonator and the electrode 1012 may be formed on the bottom of the resonator as illustrated in the side view of the device in FIG. 10B. In one implementation, the electrodes 1011 and 1012 may constitute an RF or microwave resonator to apply the RF or microwave signal to co-propagate along with the desired optical WG mode. The electrodes 1011 and 1012 may be microstrip line electrodes.

In the above optical filters with two or more coupled WGM resonators, at least one of the coupled WGM resonators may be made of a radiation-sensitive material for permanently tuning the spectral properties of the WGM resonator by illumination of the resonator with sensitizing light after it is fabricated and without changing the geometry of the resonator. In one implementation, for example, a dielectric material transparent to radiation of wavelengths in a first radiation spectral range is configured to change a refractive index of the material when exposed to sensitizing radiation at a sensitizing wavelength in a second radiation spectral range. The first spectral range may be any range in which the resonator is to be operated, such as wavelengths around 1550 nm for optical communications. The second spectral range is different and separate from the first spectral range, such as the UV range or other suitable spectral ranges different from the spectral range of the light in WG modes. A micro resonator is fabricated from the dielectric material to support whispering gallery modes for radiation in the first radiation spectral range. Next, the fabricated resonator is exposed to radiation at the sensitizing wavelength in the second radiation spectral range to modify the refractive index of the resonator until the refractive index is changed to a desired value at which the resonator produces a desired resonator spectrum in the first spectral range.

The above change of the index by exposure to the sensitizing radiation is generally permanent. This may be achieved by doping the dielectric material with radiation-sensitive ions, e.g., a Ge-doped silica that is sensitive to UV sensitizing light. Under this approach, the change in the index of the resonator is controlled by controlling the exposure. A number of advantages can be achieved with this approach. For example, the permanent nature of the change in the index avoids the technical difficulties of maintaining the precise amount of stretching or compression on the resonator in typical mechanical approaches. Different WGM resonators may be tuned with this approach to have one or more common resonator frequencies. A WGM resonator may be so tuned to a desired resonator frequency in a systematic and controllable manner. In addition, different resonant frequencies of such a resonator can be tuned at the same time as a whole so that there is no need for correcting relative shifts of spectral lines. This approach is simple without complex mechanical controls or chemical processing steps. The tuning may be monitored and controlled with desired precision.

One convenient implementation of the radiation-sensitive material for any of above WGM resonator configurations is to use a UV-sensitive material to fabricate the resonator. After the resonator is fabricated, the resonator is exposed to the UV light at the proper wavelength to change the index. Ge-doped silica, for example, has low optical losses at about 1550 nm and a high sensitivity to UV sensitizing light. It is possible to shift the index of such a silica by an amount of about $10^{-2}$ to $10^{-4}$ with proper amount of exposure to the UV light at about 351 nm. In the frequency domain, an eigen frequency of 200 THz of a WGM resonator may be shifted from 10 to 1000 GHz. For a microsphere resonator with a diameter of about 1000 microns, This shift is close to the free spectral range of the resonator. Hence, with this large tuning range comparable to the free spectral range, it is possible to design and engineer the eigen frequency of a WGM resonator to be at any desired frequency.

Referring back to the tunable filter shown FIG. 9, at least one of the WGM resonators may be made of a radiation-sensitive material to permanently tune their relative spectral properties by exposure to a proper amount of radiation. In operation, at least one of the cascaded resonators is tuned by the control 901 to tune the spectral property of the overall filter. For example, the first resonator may be made of an electro-optic material to provide dynamic tuning to the filter 900 after the fabrication is completed and during the normal operation of the filter 900. Another resonator may be made of Ge-doped silica to allow for permanently tuning of the relative spectral properties of the resonators during the fabrication of the filter 900.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Only a few implementations are disclosed. However, it is understood that variations and enhancements may be made.

What is claimed is:

1. An optical device, comprising:
   a whispering gallery mode (WGM) optical resonator configured to support one or more whispering gallery modes;
   a photodetector optically coupled to an exterior surface of the optical resonator to receive evanescent light from the optical resonator to detect light inside the optical resonator; and
   a spacer comprising a transparent material positioned between the photodetector and the exterior surface of the optical resonator, wherein the spacer is in direct physical contact with the exterior surface of the optical resonator and the photodetector.

2. The device as in claim 1, wherein the refractive index of the transparent material is less than (1) a refractive index of the optical resonator and (2) a refractive index of the photodetector.

3. The device as in claim 1, wherein the transparent material is a polymer.

4. The device as in claim 1, wherein the transparent material is coated on the photodetector.

5. The device as in claim 1, wherein the transparent material is coated on the exterior surface of the optical resonator.

6. The device as in claim 1, wherein the optical resonator is made of at least a part of a spheroid to support one or more whispering-gallery modes circulating along an equator in a circular cross section of said spheroid and around a short ellipsoid axis of said spheroid.

7. The device as in claim 1, wherein the optical resonator has a disk shape.

8. The device as in claim 1, wherein the optical resonator is made of at least a part of a sphere to support one or more whispering-gallery modes circulating along an equator.

9. The device as in claim 1, wherein the optical resonator includes an electro-optical material, and the device comprises a control unit to apply an electrical control signal to the optical resonator to tune a frequency of the optical resonator.

10. The device as in claim 9, wherein the optical resonator includes a lithium niobate crystal.

11. The device as in claim 1, comprising an optical coupler that is optically coupled to the optical resonator.

12. The device as in claim 11, wherein the optical coupler includes a waveguide.

13. The device as in claim 11, wherein the optical coupler includes a photonic bandgap material.

14. The device as in claim 11, wherein the optical coupler includes a prism.

15. A device, comprising:
first and second optical resonators each configured to support whispering gallery modes, wherein the first and said second optical resonators are optically coupled to each other to allow for light coupling from a first whispering gallery mode in the first optical resonator to a second whispering gallery mode in the second optical resonator;
a first photodetector optically coupled to the first optical resonator to detect light in the first optical resonator;
a first spacer comprising a transparent material positioned between the first photodetector and an exterior surface of the first optical resonator, wherein the first spacer is in direct physical contact with the exterior surface of the first optical resonator and the first photodetector;
a second photodetector optically coupled to the second optical resonator to detect light in the second optical resonator; and
a second spacer comprising a transparent material positioned between the second photodetector and an exterior surface of the second optical resonator, wherein the second spacer is in direct physical contact with the exterior surface of the second optical resonator and the second photodetector.

16. The device as in claim 15, wherein at least one of the first and said second optical resonators is tunable in response to a control signal.

17. A method, comprising:
placing a photodetector near an exterior surface of a whispering gallery mode (WGM) optical resonator to optically couple the photodetector to an evanescent field of light in the optical resonator;
placing a spacer comprising a transparent material positioned between the photodetector and the exterior surface of the first optical resonator, wherein the spacer is in direct physical contact with the exterior surface of the first optical resonator and the first photodetector; and
using the photodetector to receive evanescent light from the optical resonator to detect light inside the optical resonator.

18. The device as in claim 1, wherein a thickness of the spacer is controlled to set a coupling strength between the photodetector and the optical resonator, and to adjust the Q factor of the one or more whispering gallery modes.

19. The device as in claim 15, wherein a thickness of the first spacer is controlled to set a coupling strength between the first photodetector and the first optical resonator, and to adjust the Q factor of the one or more whispering gallery modes; and
wherein a thickness of the second spacer is controlled to set a coupling strength between the second photodetector and the second optical resonator, and to adjust the Q factor of the one or more whispering gallery modes.

20. The method as in claim 17, further comprising controlling a thickness of the spacer to set a coupling strength between the photodetector and the optical resonator, and to adjust the Q factor of the one or more whispering gallery modes.

* * * * *

UNITED STATES PATENT AND TRADEMARK OFFICE
CERTIFICATE OF CORRECTION

PATENT NO.         : 8,124,927 B2                                   Page 1 of 1
APPLICATION NO.    : 11/754959
DATED              : February 28, 2012
INVENTOR(S)        : Anatoliy Savchenkov et al.

It is certified that error appears in the above-identified patent and that said Letters Patent is hereby corrected as shown below:

On Page 2, item (56), in Column 2, under "OTHER PUBLICATIONS", Line 6, delete "Sympsoium" and insert -- Symposium --, therefor.

On Page 3, item (56), in Column 2, under "OTHER PUBLICATIONS", Lines 2-3, delete "Tecnhology," and insert -- Technology, --, therefor.

In Column 2, Line 52, delete "spheriodal" and insert -- spheroidal --, therefor.

In Column 5, Line 47, delete "applications" and insert -- applications. --, therefor.

In Column 6, Line 40, delete "resonator 610" and insert -- resonator --, therefor.

In Column 6, Line 41, delete "FIG. 9A." and insert -- FIG. 8A. --, therefor.

In Column 6, Line 42, delete "FIG. 9A." and insert -- FIG. 8A. --, therefor.

In Column 7, Line 50, delete "microns," and insert -- microns. --, therefor.

Signed and Sealed this
Fourteenth Day of August, 2012

David J. Kappos
*Director of the United States Patent and Trademark Office*